United States Patent [19]

Thomas

[11] Patent Number: 4,488,047
[45] Date of Patent: Dec. 11, 1984

[54] HIGH EFFICIENCY MULTIPLE LAYER, ALL SOLID-STATE LUMINESCENT SOLAR CONCENTRATOR

[75] Inventor: William R. L. Thomas, Holmdel, N.J.

[73] Assignee: Exxon Research & Engineering Co., Florham Park, N.J.

[21] Appl. No.: 324,964

[22] Filed: Nov. 25, 1981

[51] Int. Cl.³ .................... H01L 31/04; G02B 5/14
[52] U.S. Cl. ............................ 250/486.1; 250/368; 250/367; 136/247
[58] Field of Search ............ 250/486.1, 367, 368, 250/458.1; 136/247

[56] References Cited

U.S. PATENT DOCUMENTS

| 3,311,773 | 3/1967 | Turner | 250/486.1 |
| 4,149,902 | 4/1979 | Mauer et al. | 250/486.1 |

FOREIGN PATENT DOCUMENTS

| 2737847 | 3/1979 | Fed. Rep. of Germany | 136/247 |
| 794577 | 1/1981 | U.S.S.R. | 250/458.1 |

OTHER PUBLICATIONS

Goetzberger et al., "Solar Energy Conversion with Fluorescent Collectors", Appl. Phys. 14, 1977, pp. 123–139.

Primary Examiner—Alfred E. Smith
Assistant Examiner—Carolyn E. Fields
Attorney, Agent, or Firm—Joseph J. Dvorak

[57] ABSTRACT

Simply stated, the luminescent solar concentrator of the present invention comprises a plurality of optically coupled flat planar luminescent layers having a major surface for receipt of incident radiation and at least one edge surface through which radiation can escape, each of said layers having on the top and bottom surface thereof a light transparant layer having an index refraction which is lower than the index refraction of the luminescent layer. All of the layers are joined so as to form an all solid state luminescent solar collector.

9 Claims, 4 Drawing Figures

HIGH EFFICIENCY MULTIPLE LAYER, ALL SOLID-STATE LUMINESCENT SOLAR CONCENTRATOR

BACKGROUND OF THE INVENTION

1. Field of the Invention

The subject invention is concerned with solar collectors of the type in which a flat planar material containing a luminescent substance is used to absorb incident solar radiation which is then emitted by the luminescent material in the form of radiation of a lower frequency and in which the emitted radiation is transported to an exiting edge by internal reflection.

2. Prior Art

There are numerous publications and patents which deal with the conversion of solar energy to different wavelengths by means of luminescent or fluorescent materials. Among these publications and patents, specific reference is made to the following: W. H. Weber et al, Applied Optics, Volume 15, pages 2299-2300 (1976); Levellett et al, Applied Optics, Volume 16, pages 2684—2689; Reisfeld et al, Nature, Volume 274, pages 44–145 (1978); Goetzberger et al, Applied Physics, Volume 14, pages 123–139; Pittsburger Proceedings, 2nd European Community Photovoltaic Solar Energy Conference Berlin. Apr. 23-26, 1979; Reidel Publishing Company, pages 515-523 (1979); U.S. Pat. No. 4,110,123; U.S. Pat. No. 4,146,790; U.S. Pat. No. 4,149,902; and U.S. Pat. No. 4,190,465.

Basic to the solar energy concentrators of the above mentioned references is a light conducting medium in the form of a flat planar material having two opposing parallel surfaces of extended area relative to the edge surfaces of the medium. This planar layer typically consists of glass or plastic and contains a luminescent material, i.e., a luminescor, which absorbs solar radiation, thereby exciting the luminescor. The excited luminescor then emits electromagnetic radiation at a longer wavelength with an isotropic distribution of direction of propagation. Since a large fraction of the emitted radiation will reach the surface of the planar layer at an angle which is greater than the critical angle, the radiation will be trapped within the layer by internal reflection. This trapped radiation can only escape through an edge of the planar layer. In this manner, the solar radiation falling on the large major surface of the planar concentrator is emitted in a concentrated form through an edge.

The efficiency of such collectors is impacted by numerous factors. As is suggested, for example, in Weber et al, Applied Optics, Volume 15, page 2330 (1976), in order to prevent degradation of the total internal reflection of such a collector, the collector should be kept in an enclosed container to keep its surfaces free of any scattering or absorbing contaminants.

Other factors which affect the achievable efficiency for a luminescent solar collector include the radiation reabsorbed by the luminescor in the fluorescent layer, as well as transmission losses of the basic glass or plastic material containing the luminescor, and nonradiative losses such as photo thermal conversion and photochemical degradation.

As a practical matter, efficiencies only in the order of 1% to 15% have been achieved with luminescent solar collectors having concentration ratios ranging from about 4 to 20. Thus, there remains an apparent need to develop luminescent solar collectors that have higher efficiencies, for example, efficiencies in the order of 15% to 40% with concentration ratios of 20 to 10,000.

SUMMARY OF THE INVENTION

Simply stated, the luminescent solar concentrator of the present invention comprises a plurality of optically coupled flat planar luminescent layers having a major surface for receipt of incident radiation and at least one edge surface through which radiation can escape, each of said layers having on the top and bottom surface thereof a solid light transparent layer having an index refraction which is lower than the index refraction of the luminescent layer.

In one preferred embodiment of the present invention, the device has five luminescent layers.

In another embodiment of the present invention, the light transparent intervening layers are generally greater than about 5 microns in thickness and typically are in the range of about 10 to 200 microns of thickness, while the luminescent layers range typically from greater than about 100 microns thick, and, indeed, in the range from about 100 to 5,000 microns in thickness. Typically, the fluorescent containing layer will be either glass or plastic, such as polymethylmethacrylate or polycarbonate containing luminescent materials or luminescors such as organic dyes and inorganic ions such as Coumarin 4, Fluorol 555, uranyl ions, europium ions or neodynium ions.

The many embodiments contemplated as within the purview of the present invention and their features and advantages will become apparent on a reading of the specification in light of the following drawings.

DETAILED DESCRIPTION OF THE INVENTION

Figure 1:
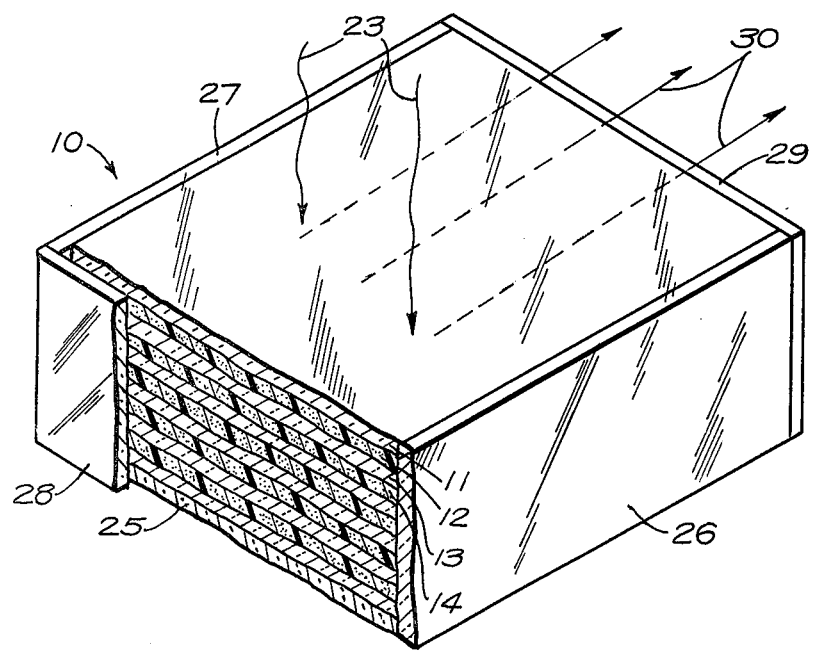
FIG. 1 is a sketch, partially in perspective and partially broken away showing one geometric configuration of a fluorescent solar collector in accordance with the present invention.
Figure 2:
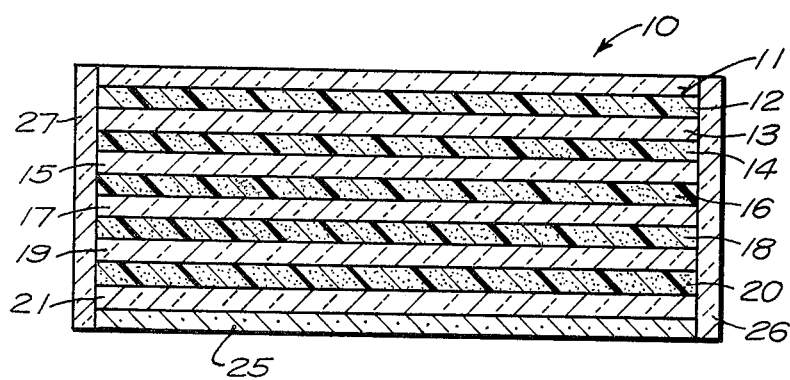
FIG. 2 is a cross-section of a fluorescent collector in accordance with the principles of the present invention.

The luminescent solar collector proposed by the present invention is illustrated particularly in FIGS. 1 and 2, wherein the luminescent solar collector is shown generally as 10 having a plurality of fluorescent layers 12, 14, 16, 18 and 20. Each of the fluorescent layers are sandwiched between light transmitting layers 11, 13, 15, 17, 19 and 21.

It should be apparent that each of the multiple layers of fluorescent and light transmitting layers are bonded one to the other so as to provide solid multiple layered fluorescent collector device.

As can be seen, particularly in FIG. 1, the fluorescent collector has a generally planar configuration having a large major surface for receipt of incident solar radiation, which radiation impinging on the major surface is designated generally by arrows 23. The bottom surface is provided with a mirror 25 as well as side walls 26 and 27. In the embodiment shown in FIG. 1, end wall 28 is also provided with a mirrored surface, whereas end wall 29 is not, thereby providing for a means of egress for the totally internally reflective light. As is shown in FIG. 1, light absorbed by the fluorescent material in the multiple layers making up the fluorescent collector is shown, by arrows 30, exiting from the side edge 29 of the planar collector 10.

In the practice of the present invention, the luminescent layers 12, 14, 16, 18 and 20, for example, consist of a luminescent material embedded, for example, in a layer of plastic or glass. Typically luminescent organic dyes include Rhodamine B, Coumarin 6, Coumarin 4, and fluorescien. Typical inorganic luminescent ions include $Nd^{+3}$ and $Eu^{+3}$. Among the plastic materials suitable for serving as a matrix for the luminescent materials are polymethylmethacrylate, polycarbonate and the like. In general, the luminescent layers will be generally of from about 100 microns to 5,000 microns centimeters thick.

Additionally, the luminescent layers absorb in the range of 0.4 to 1.3 millimicrons in wavelength, with each next adjacent layer of luminescent material absorbing over a range of wavelength which is substantially separate and distinct from the absorption of the next adjacent layer of luminescent material. The preferred absorption profile of each luminescent layer is shown schematically in FIG. 3, for example.

As indicated previously, each of the luminescent layers is sandwiched between light transparent layers, such as layers 11, 13, 15, 17, etc., as shown in FIG. 2. These light transparent layers are generally in the range of about 5 to 10,000 microns thick, and preferably in the range from about 10 to 200 microns. The transparent intervening layers in accordance with the practice of the present invention must have an index of refraction which is lower than the index of refraction of the liminescor containing layers. These intervening light transparent layers may be selected from materials such as polysilicones, fluorinated polymers and polyvinyl chloride.

The intervening layers serve a number of functions and purposes, one of which is to minimize the amount of energy that is not internally reflected due to surface phenomena. The intervening layer also serves to bond and optically couple each of the luminescent layers into a single solid unit and to hermetically seal the luminescor containing layers.

To illustrate the significance of the device of the present invention, consider the following calculation of the efficiency of a luminescent solar collector of the present invention. For the purpose of the calculation, the device was considered to have the luminescent material having the shortest wavelength absorber 20 at the base of the device near mirror 25 as is shown in FIG. 2. Each of the next succeeding luminescent layers proceeding from the bottom to the top of the device each absorb at the next highest wavelength.

Figure 3:
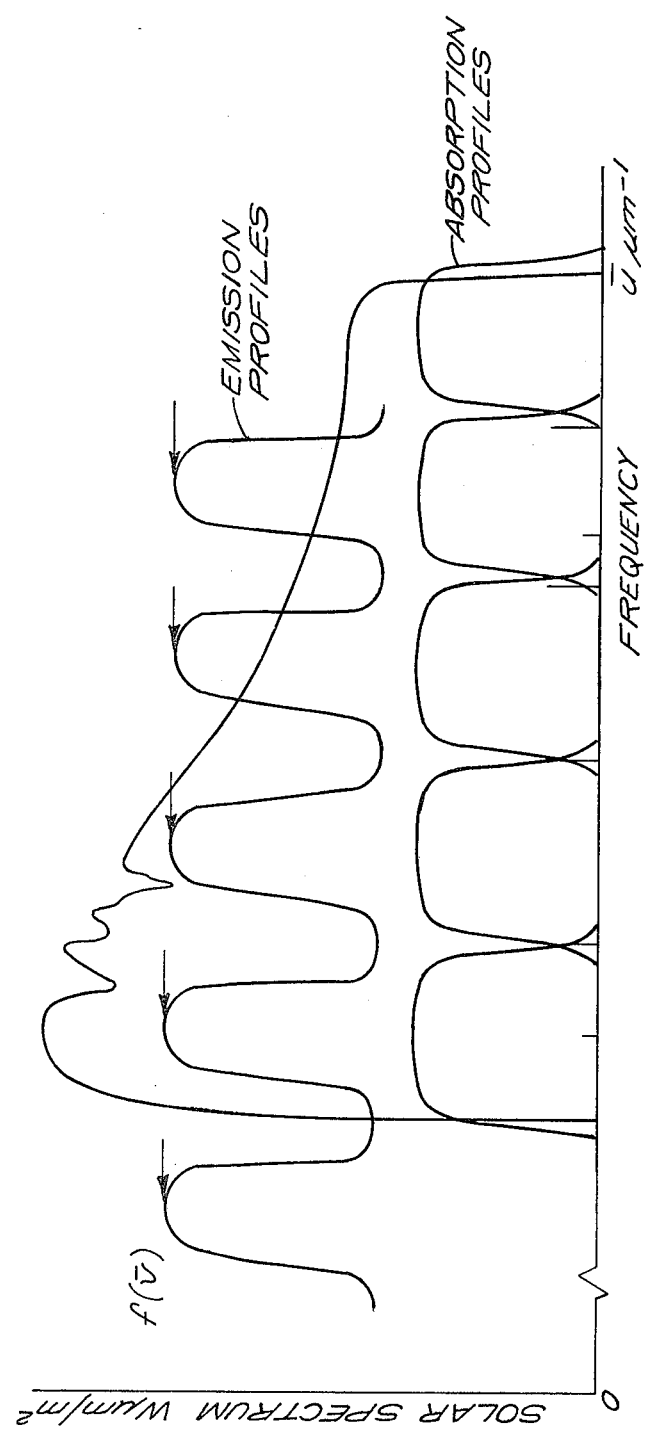
FIG. 3 is a schematic illustration of the absorption and emission profiles of the preferred fluorescent collector in accordance with the present invention.
Figure 4:
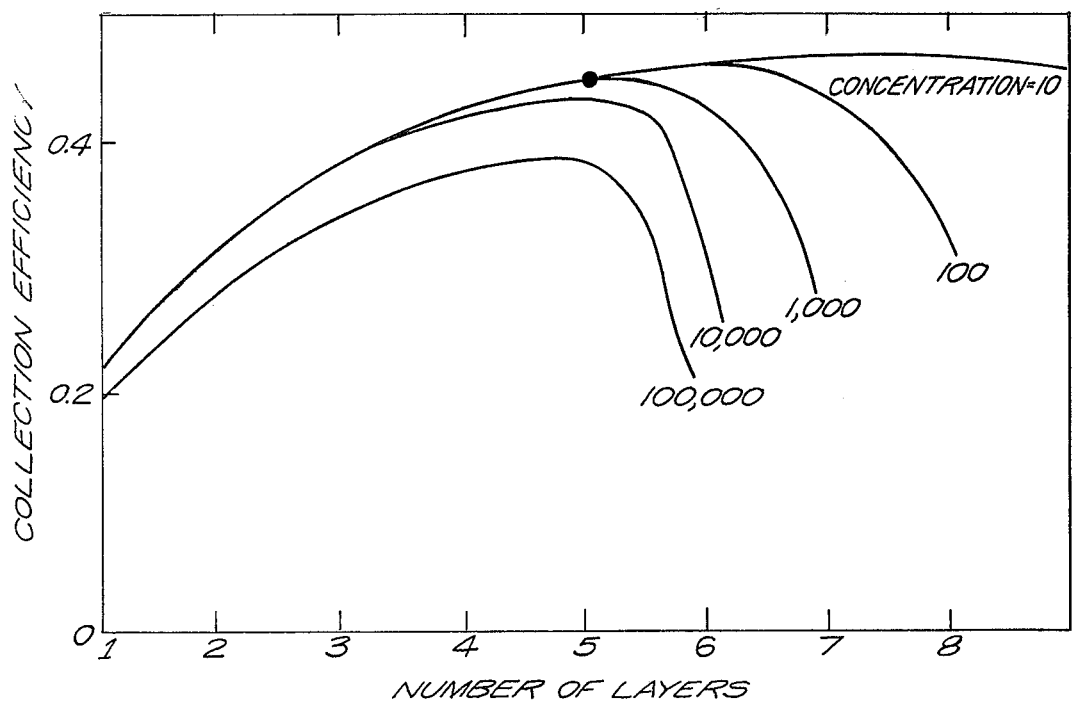
FIG. 4 is a schematic diagram showing the relationship between collector efficiency and the number of layers of luminescent material as a function of the concentration ratio of the collector.

As is shown in FIG. 3, each of the five luminescent layers adsorbed radiation so as to completely encompass the solar spectrum between 0.4 and 1.3 millimicrons in wavelength with virtually no overlap of absorption bands. In this way the emitted radiation in each layer can be absorbed by the layer above. Also, for the purpose of the calculations, the size of the collector was considered to be 1.0 $m^2$ and the geometric concentration ratio was 1,000. The absorber was assumed to have a quantum efficiency of 0.9. The medium containing the luminescors was assumed to have an absorption coefficient of 0.1 per meter. The ratio of the refractive index between the luminescor containing layers and the intervening layers was assumed to be 1.2 and the loss of energy per bounce due to imperfect total internal reflection was assumed to be 1 part in $10^6$.

Using the basic assumptions set forth above and varying the number of luminescent layers and concentration ratio, the computer calculations indicate that the collection efficiency for a high geometric concentration device, that is a device having a concentration of a ratio greater than about $10^3$ and generally in the range from about 10 to 10,000, consists of about five luminescent layers. With more than five luminescent layers, the solar spectrum is divided into smaller divisions resulting in the emission spectrum overlapping to a significant degree the absorption spectrum in each layer with the concomitant result that self-absorption of the emitted radiation will occur leading to a reduction in the overall efficiency of the concentration device. With less than five layers, the photon energy of the emitted radiation from the luminescor is significantly reduced from the energy of the incoming absorbed photon, leading to a reduction in collection efficiency. It should be noted that although the trapping efficiency for each luminescent layer is reduced by the structure of the device of the present invention, the arrangement of the luminescent layers in an all solid multilayered device with reduced reflectivity losses at the surfaces results in a device with enhanced overall efficiency.

As will be evident to those skilled in the art, various modifications of this invention can be effected within the sphere of the scope of the invention as described in the foregoing disclosure and discussion and as defined in the appended claims.

What is claimed is:

1. An all solid luminescent solar concentrator comprising:
    a plurality of planar luminescent layers having a major top surface for receipt of incident solar radiation, a bottom surface, and at least one edge surface through which radiation can escape, each of said layers having bonded on the top and bottom surface thereof a solid light transparent layer having an index of refraction which is lower than the index of refraction of the luminescent layer.

2. The concentrator of claim 1 wherein said luminescent layer absorbs at a different wavelength.

3. The concentrator of claim 2 wherein the luminescent layers are arranged so that the luminescent layer absorbing at the shortest wavelength is at the bottom of the device and each succeeding luminescent layer proceeding from the bottom to the top of the device absorbs at the next highest wavelength.

4. The concentrator of claim 3 wherein said plurality of luminescent layers absorbs at wavelengths ranging from 0.4 millimicron to 1.3 millimicrons.

5. The concentrator of claim 4 wherein said light transparent layers are greater than about 5 microns in thickness.

6. The concentrator of claim 5 wherein said luminescent layers are greater than about 100 microns in thickness.

7. The concentrator of claim 6 wherein the thickness of the light transparent layers is in the range of from about 10 to 200 microns and the thickness of the luminescent layers is from about 100 to 5000 microns.

8. The concentrator of claim 7 wherein there are five luminescent layers.

9. A planar fluorescent solar concentrator comprising:
five luminescent layers, each having a major top surface for receipt of incident solar radiation, a bottom surface, and at least one edge surface through which radiation can escape, each of said luminescent layer absorbing at different wavelengths, said luminescent layers being arranged so that the luminescent layer absorbing at the shortest wavelength is at the bottom of the device and each succeeding luminescent layer proceeding from the bottom to the top of the device absorbs at the next highest wavelength, each of said layers having on the top and bottom surface thereof a light transparent layer having an index of refraction which is lower than the index of refraction of the luminescent layers, all of said luminescent and light transparent layers being handed in a single solid structure.

* * * * *